United States Patent [19]
Balch

[11] Patent Number: 5,268,633
[45] Date of Patent: Dec. 7, 1993

[54] TESTING OPERATION OF ELECTRIC ENERGY METER OPTICS SYSTEM

[75] Inventor: Richard A. Balch, North Hampton, N.H.

[73] Assignee: General Electric Company, Somersworth, N.H.

[21] Appl. No.: 841,207

[22] Filed: Feb. 27, 1992

Related U.S. Application Data

[60] Continuation of Ser. No. 628,133, Dec. 17, 1990, abandoned, which is a division of Ser. No. 505,199, Apr. 5, 1990.

[51] Int. Cl.$^5$ ............................................. G01R 31/00
[52] U.S. Cl. ........................................ 324/74; 324/110; 324/96; 307/311
[58] Field of Search .................. 324/96, 122, 74, 110, 324/175; 307/311, 350

[56] References Cited

U.S. PATENT DOCUMENTS

| | | | |
|---|---|---|---|
| 2,586,008 | 2/1952 | Davis, III | 324/74 |
| 2,957,133 | 10/1960 | Burkhart, Jr. | 324/74 |
| 2,980,856 | 4/1961 | Van Krevelen | 324/74 |
| 3,705,316 | 12/1972 | Burrows et al. | 307/311 |
| 3,811,056 | 5/1974 | Baba et al. | 307/311 |
| 4,240,030 | 12/1980 | Bateman et al. | 324/110 |
| 4,318,010 | 3/1982 | Hurley, III et al. | 307/311 |
| 4,423,322 | 12/1983 | Smith | 307/311 |
| 4,445,087 | 4/1984 | Mehnert | 324/175 |
| 4,484,331 | 11/1984 | Miller | 307/311 |
| 4,485,301 | 11/1984 | Gontowski, Jr. et al. | 307/311 |
| 4,598,198 | 7/1986 | Fayfield | 307/311 |
| 4,600,881 | 7/1986 | La Rocca et al. | 324/74 |
| 4,646,003 | 2/1987 | Phillips et al. | 324/74 |
| 4,654,662 | 3/1987 | Van Orodel | 340/870.03 |
| 4,670,737 | 6/1987 | Rilling | 340/347 P |
| 4,766,370 | 8/1988 | Carr | 324/74 |
| 4,827,123 | 5/1989 | Gray | 250/231 SE |

Primary Examiner—Ernest F. Karlsen
Assistant Examiner—William J. Burns
Attorney, Agent, or Firm—John S. Beulick

[57] ABSTRACT

A method and apparatus for testing the proper operation of the optical elements in the optical detection circuit of an electronic register in an energy meter. The light emitter circuit is periodically pulsed adequate to turn the emitters to the on condition, and a comparison circuit is provided in which the voltage across a monitor point in circuit with the light emitters and a switching circuit is monitored both before and after each pulse. The absence of a voltage change upon pulsing the light emitter circuitry is used to generate a first error or failure signal. The light detector is read prior to each pulse to determine if unprogrammed light is being received prior to the pulsing of the light emitter as an indication of tampering with the accurate reading of the energy meter, and a second error signal is generated in response to unprogrammed light. The first error signal is displayed at the energy meter to the meter reader, while the second error tampering signal is stored and downloaded through an optical link for analysis at the power company.

28 Claims, 3 Drawing Sheets

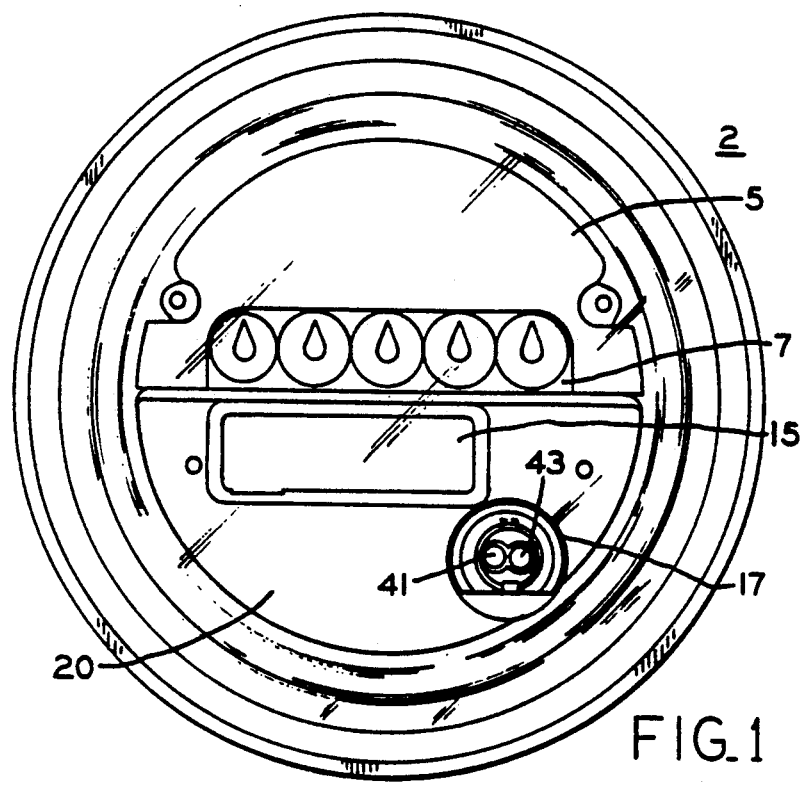
FIG_1
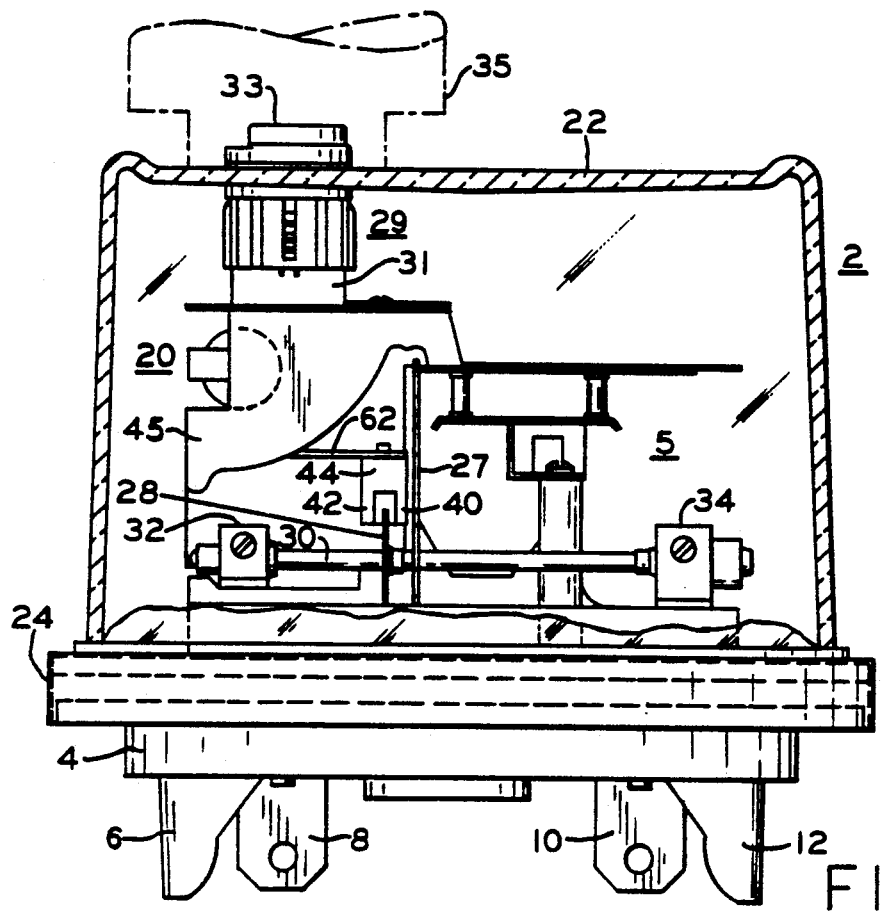
FIG_2

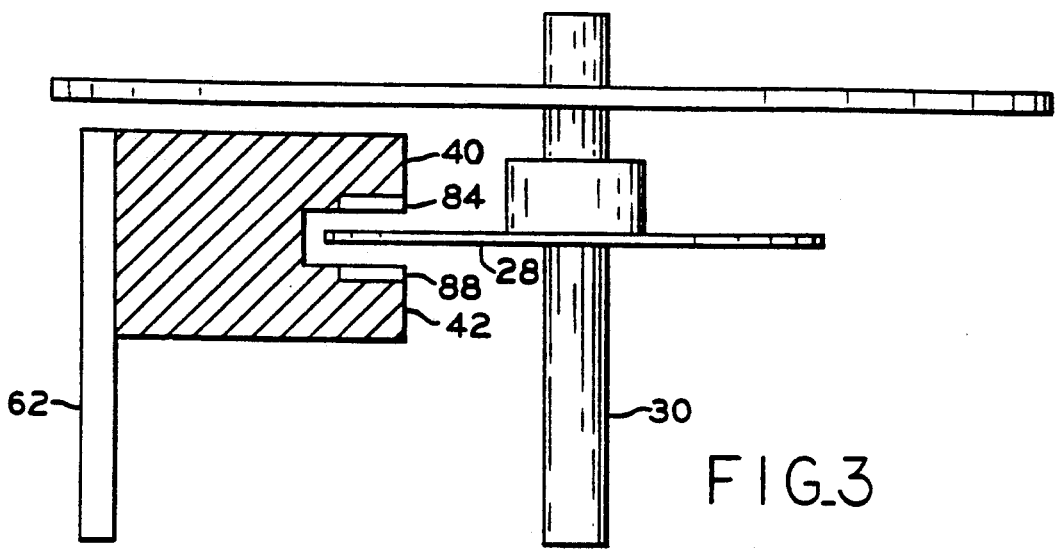
FIG_3
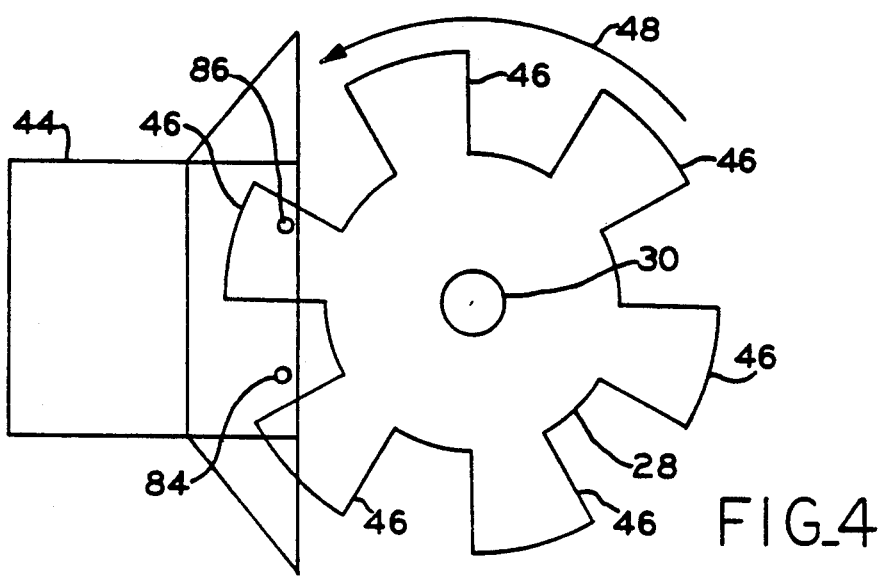
FIG_4
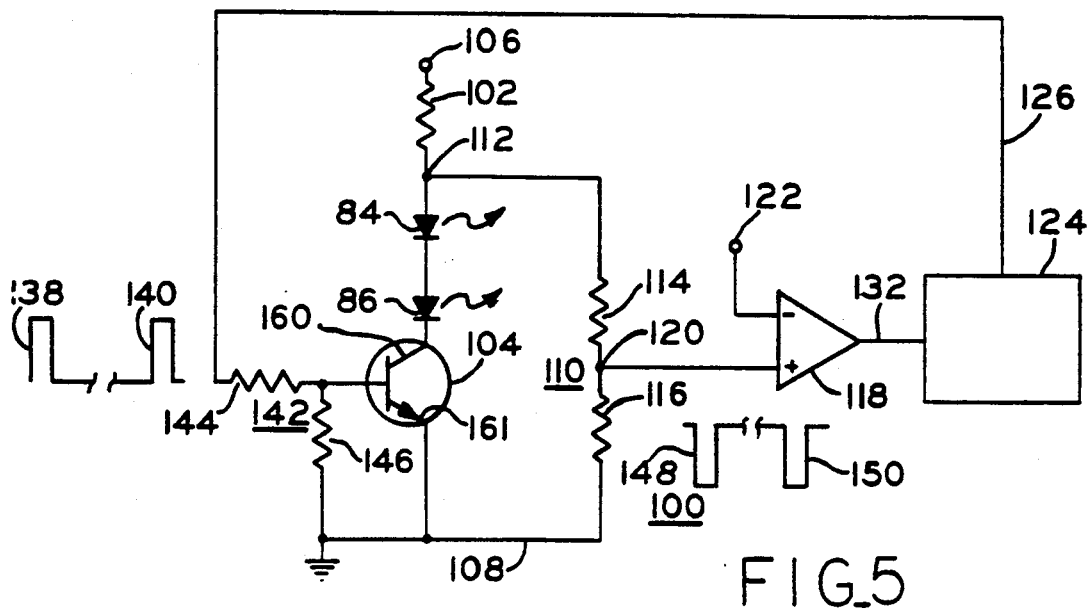
FIG_5

TESTING OPERATION OF ELECTRIC ENERGY METER OPTICS SYSTEM

This application is a continuation of application Ser. No. 07/628,133 filed Dec. 17, 1990, now abandoned, which is a division of application Ser. No. 07/505,199 filed Apr. 5, 1990, now abandoned.

BACKGROUND OF THE INVENTION

The present invention relates to energy meters with electronic registers, and more particularly to the provision of a method and apparatus for testing the operation of the optical electronics system when used in such meters.

Present-day electronic registers have greatly expanded capabilities and are being called upon to provide additional functions beyond simple measurements of kilowatthour energy consumption and kilowatt demand. The inclusion of microprocessors in electronic registers has provided the capability to provide a plurality of additional functions, and make additional information available to the customer, the meter reader and the serviceman. In electronic registers, it is well-known to utilize optical electronics to measure energy consumed by the load being metered. In a combination induction electric watthour meter and time of use or demand electronic register, the watthour meter utilizes an eddy current disk which rotates in response to the rate of energy consumption being metered. A shutter is commonly mounted on the same shaft as the eddy current disk and is positioned to rotate between a light emitter and a light detector. A plurality of circumferential teeth on the rotating shutter sequentially break the light beam between the light emitter and light detector to provide a series of electrical pulses which are directly proportional to the rate of energy consumption by the load being metered.

It is common practice to provide an optical communications link between the electronic register and the outside of the meter in order to provide an interface to a portable reader, providing an automatic means for extracting billing data and for programming the electronic register.

It is possible that the electronic circuitry associated with the disk sensing optics system may fail even though the eddy current disk continues to rotate and the induction watthour meter continues to properly display kilowatt hours of power consumed by the load being metered. A problem exists if a register light emitter should fail, particularly if this occurs shortly before the electronic register is read by the meter reader. For example, if meter readings are taken once a month and if one of the light emitters fails just prior to a particular meter reading, the absence of the time of use readings provided by the electronic register may not become apparent until the following month or other period when the register is next read. It is thus desirable to provide for the testing of the operation of the light emission circuitry in the disk sensing optics system of an electronic register, since this is more likely to fail than the induction watthour meter. This would provide the meter reader with an indication of the operation of the disk sensing optics system circuitry each time, and at the time, the electronic register is read and enable prompt corrective action. In particular, it is desirable to be able to determine whether the light emitter circuitry is operating at the time of meter reading, while at the same time minimizing the requirement for additional components and added complexity of the electronic register.

As with all energy meters, including energy meters with electronic registers, where the customer pays for energy consumption based on the meter readings, it is important to provide the ability to detect tampering attempts which can be anticipated. One form of tampering includes the use of high intensity light, particularly infrared light, which is directed from the outside of the energy meter towards the disk sensing optics assembly. Since energy consumption, or the rate of energy consumption, is detected in the disk sensing optics assembly by the rate at which the toothed shutter interrupts the light path between the light source and the light detector as it rotates between them, an extremely bright light shining on the light detector could interfere with the detector sensing interruptions of the normal operating light beam by the passage of teeth on the toothed shutter.

As a result, means are needed to detect whether there has been tampering with the electronic register through use of an extremely bright external light source. It is also highly desirable that this be accomplished simply, reliably, and efficiently.

In addition, it is desirable that the failure error signal be available at the electronic register for the information and use of the meter reader. It is desirable that the tamper error signal be stored within, but not available at, or displayed by, the electronic register. It is desirable that the tamper error signal be provided instead to the office of the power company for analysis and appropriate action, whether customer relations or legal action, as appropriate.

OBJECTS AND SUMMARY OF INVENTION

It is an object of the present invention to provide means for testing the operation of the disk sensing optics system of an electronic register.

It is a further object of the present invention to provide for the testing of the light emitter circuitry of a disk sensing optics system in an electronic register with a minimum of components and complexity.

It is another object of the present invention to provide a means of testing the disk sensing optics systems of an electronic register for excessive external light.

It is yet another object of the present invention to detect tampering with an electronic register and to store that information for subsequent retrieval without alerting the person doing the tampering, while displaying other error signals at the electronic register.

In accordance with one embodiment of the present invention, a comparator is provided to test the light transmission circuitry in an electronic register utilizing the interruption of electro-optical light transmission between infrared light emitters and light detectors to measure energy use. The infrared emitters are connected in series with a switching transistor which is pulsed to energize the infrared emitters. The current through the infrared emitters is checked before and during the energizing of the infrared emitters. An error is detected if there is no significant difference.

More particularly, the comparator circuit includes a reference voltage and a transistor connected in series with a resistor and the light emitters. The difference in current flow through the series circuit as a result of light detector pulsing is checked by monitoring the voltage at the junction of the resistor and the light emitters. A voltage divider is connected in series with the resistor and in parallel with the light emitters and transistor. The voltage across one resistor in the voltage divider is fed to a comparator whose output is connected to a microprocessor which stores, and delivers on command, an indication of a light emitter error when the voltage being monitored does not change with the pulsing of the transistor.

The light detectors are read prior to pulsing of the light emitters to determine if light is being received without pulsing which would indicate possible light tampering by a person attempting to evade proper energy consumption billing by shining a bright light on the detectors. The tamper error signal is stored in the electronic register but is not made available at the energy meter as is the failure error signal. The tamper error signal is downloaded through an optical link to the computer at the office of the power company for analysis and response.

BRIEF DESCRIPTION OF DRAWINGS

FIG. 1 shows an electronic energy meter incorporating one embodiment present invention.

FIG. 2 is a side view of FIG. 1.

FIG. 3 shows the optical electronic arrangement for obtaining pulses responsive to energy consumption.

FIG. 4 is a top view of FIG. 3.

FIG 5 shows the circuitry provided to test the operation of the optics system.

Figure 6:
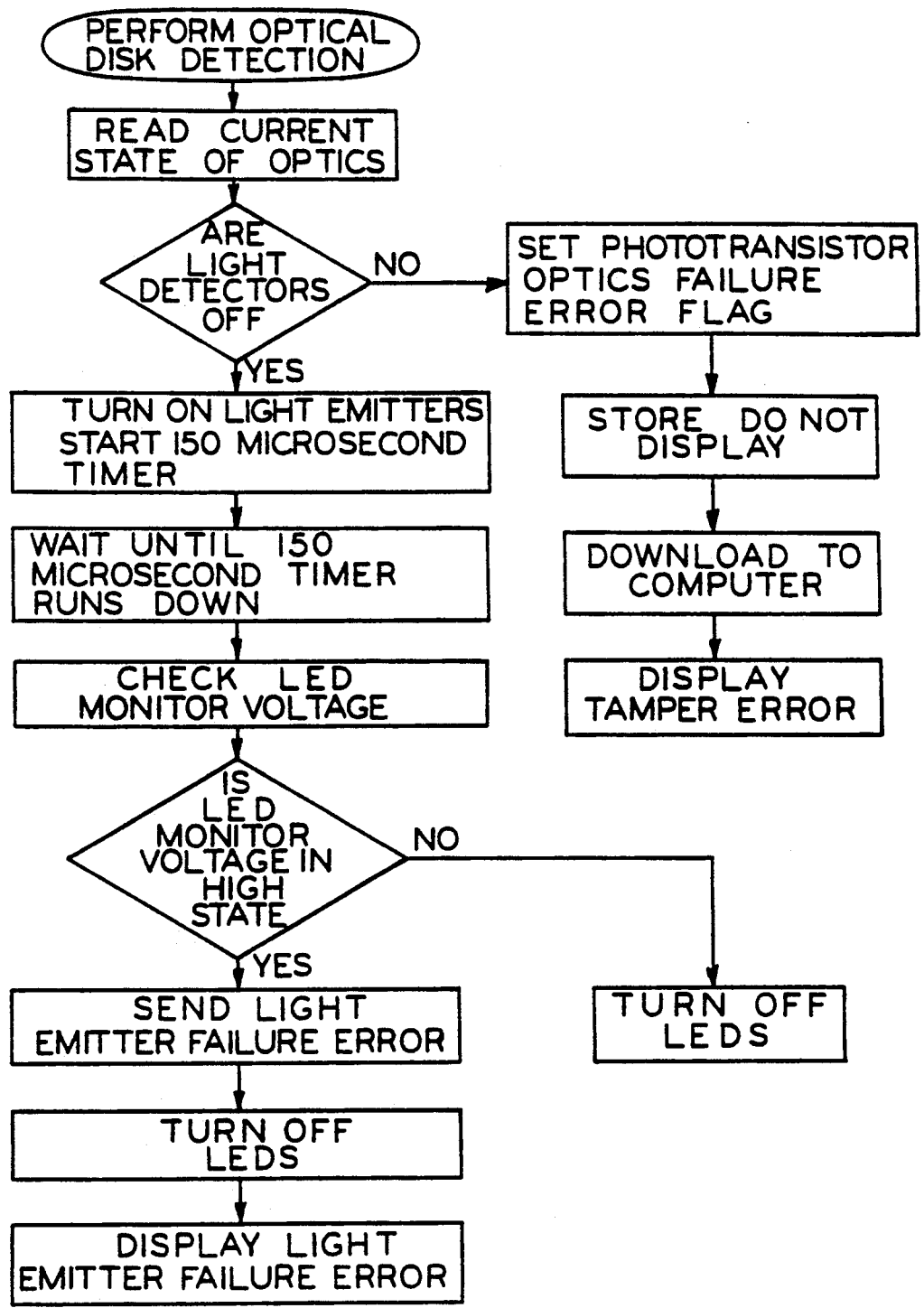
FIG. 6 is a block diagram useful in explaining the procedure and method used in providing an output indication on the status of the light emitting optics system.

Referring first to FIGS. 1 and 2, an electric energy or power meter 2 is shown in simplified form, and includes a base 4 having a plurality of meter circuit terminals such as 8 and 10 extending through the base to connect the meter in circuit with a power source and a load which is to be metered. An electronic register assembly 20 is positioned remote from the base 4 and meter circuit terminals 8 and 10. The internal electronics and mechanism of the energy meter 2 are enclosed by a transparent cover or enclosure 22 which is secured to the base 4 by a locking ring 24. In a manner well known in the art, the eddy current disk 27 on shaft 30 is caused to rotate within bearings 32 and 34 at a speed proportional to the electric energy provided to, and consumed by, the load to which the electric energy meter 2 is connected through circuit terminals such as 8 and 10, and the watthour meter 5 integrates the revolutions of the eddy current disk as a measure of power consumption. A circular shutter disk 28 is also supported on shaft 30 for rotation with eddy current disk 27.

The electric energy meter 2 in addition to the induction watthour meter 5 with a dial read out assembly 7, includes an electronic register assembly 20. The electronic register 20 includes a liquid crystal display 15, and an optical coupler 17 which is part of the optical communications port 29. Details of an electric energy meter to which the present invention is applicable are set forth in United States Patent application, Ser. No. 07/505,195, issued Jun. 25, 1991, U.S. Pat. No. 5,027,056 of A. A. Keturakis, S. D. Velte, J. G. Rusillo, Jr., and R. A. Balch assigned to the same assignee as the present invention, and hereby incorporated by reference.

The optical communications port 29 is provided to optically connect the electronic register 20 to the outside of the energy meter 2. As shown in FIG. 2, the optical communications port 29 includes a shroud assembly 31 between the electronic register assembly 20 and transparent cover 22, and an optical coupler 33 positioned outside, and passing through, the cover to provide an optical connection from outside the cover to the optical electronic register 20 of the energy meter 2. A meter reader during periodic readings, such as once a month, positions an optical reader, shown generally as 35, over the optical coupler to read the output of register assembly 20, and if required, to program, or reprogram the register time of use periods. The output of the register assembly 20 is stored in the optical reader, and subsequently downloaded into a computer at the office of the power company for billing and analysis purposes. As shown in FIG. 1 a light emitter 41 and light detector 43 positioned within the enclosure 45 of register assembly 20 provide the optical interface between the optical reader 35 positioned over the optical coupler 33 and the optical electronic circuitry of the register assembly. The details of the optical communications port 29 is described in copending U.S patent application Ser. No. 07/505,970, issued Oct. 15, 1991 as U.S. Pat. No. 5,057,767 filed by A. A. Keturakis and S. D. Velte, assigned to the same assignee as the present invention, and hereby incorporated by reference.

As shown somewhat schematically by FIGS. 3 and 4, the shutter 28 is mounted on, and rotates with, shaft 30 between spaced jaws 40 and 42 of the disk sensing optics assembly 44. As best shown in FIG. 4, the optical shutter 28 is castellated and includes a plurality of circumferential radially extending teeth 46 which sequentially pass between the spaced jaws 40 and 42. Positioned within the spaced jaws 40 and 42 are 2 light emitters 84 and 86, and paired detectors 88 and 90, respectively, which provide light transmission and reception in the path of the teeth 46. Upon rotation of the disk 28 in the direction shown, for example, by arrow 48, the teeth 46 will sequentially rotate first past one light emitter and detector pair 86, 90 and then past the second light emitter and detector pair 84, 88. A light source or light emitter 84, 86 is thus positioned above and on the opposite side of the optical shutter 28 from the cooperating light detectors 88, 90 respectively. As shown in FIG. 3, the light detector 88 is positioned in jaw 42 below a light emitter 84 in jaw 40. Light detector 90 in jaw 42 is similarly positioned below a light emitter 86 in jaw 42, and on the opposite side of the optical shutter 28, such that the light transmissions from the light emitters to the light detectors are interrupted every time a tooth 46 passes between the jaws. The light emitters 84 and 86 may be light emitting diodes (LEDs) providing infrared (IR) light upon energization, and the light detectors 88 and 90 are responsive to the type of light transmitted by the light emitters.

The disk sensing optics assembly 44 of the present invention is secured to the register printed circuit board 62 which is located within the electronic register assembly 20 of the electric energy meter 2 as disclosed in copending patent application Ser. No. 07/505,383, issued Jul. 23, 1991 as U.S. Pat. No. 5,034,682 of A. Keturakis, R. C. Mayo, and S. D. Velte, assigned to the same assignee as the present invention and hereby incorporated by reference.

Referring next to FIG. 5, FIG. 5 is a schematic of a comparator circuit 100 used to provide signals which are indicative of the operation, or of the failure, of a light emitter 84 or light emitter 86. Referring to FIG. 5, the light emitters 84 and 86 are connected in series with resistor 102 and the collector 160 of transistor 104. The emitter 161 of transistor 104 is connected to ground 108, and the remote end of resistor 102 is connected to the supply voltage 106 which varies from 10 to approximately 16 volts. A voltage divider 110 consisting of resistors 114 and 116 is connected between ground 108 and the monitor point 112 at the junction between resistor 102 and light emitter 84. The junction 120 between resistors 114 and 116 is connected to the positive terminal of the comparator 118, while the negative terminal of comparator 118 is connected to a reference voltage 122 of 2.7 volts. The output 132 of comparator 118 is provided to microprocessor 124 of the electronic register 20.

Current flow through the resistive circuit of 102, 114 and 116, causes a voltage at monitor point 112 Which is higher than the reference voltage 122. Current flow through the light emitters 84 and 86 upon pulsing of transistor 104 to the on condition causes additional current flow through resistor 102, such that the voltage at monitor point 112 will decrease to approximately 4 volts.

The voltage divider consisting of resistors 114 and 116 is connected in parallel with, and across the voltage at monitor point 112, such that there is current flow through the series circuit consisting of resistors 102, 114 and 116 whether or not there is current through the parallel branch including light emitters 84 and 86, transistor 104, and resistor 102. The resistance of the voltage divider 110 is large compared to the resistance of the branch including light emitters 84 and 86 and transistor 104 when there is conduction through the light emitters. Accordingly, current flow through the branch consisting of the light emitters 84 and 86 and transistor 104 will significantly increase the current flow through resistor 102, significantly lowering the voltage at monitor point 112 in the presence of such current flow.

The signal at junction 120 of voltage divider 110 is thus responsive to the voltage at monitor point 112 and varies in accordance with current flow through the branch including the light emitting diodes 84 and 86 and the transistor 104. When such current flow occurs, the voltage at junction 120 is low, or in the low state. In the absence of current flow through the light emitting diodes 84 and 86 and transistor 104, the voltage at junction 120 is high, or in the high state.

Operation of the present invention can best be understood with reference to FIGS. 3-6 and in particular to FIG. 6. Referring to FIGS. 3-6, the state of the optics is first checked by reading the output of the light detectors 88 and 90 which will be in the high state when the light emitters 84, 86 are off.

During every period of the basic interval interrupt of 7.8125 milliseconds, the microprocessor 124 timing circuit provides a timing signal 126, a series of 150 microsecond positive pulses or square waves such as 138 and 140, to the base of transistor 104 through a second divider circuit 142 consisting of resistors 144 and 146. Light emitters 84 and 86 are thus periodically pulsed for approximately 150 microseconds, that is, for a relatively small portion of the short basic interval interrupt. The pulses cause conduction of transistor 104 through resistor 102, and the light emitters 84 and 86, only if the light emitters are operating. If the light emitters 84 and 86 are conducting, the voltage at the monitor point 112 will decrease, which is reflected at junction 120, providing negative pulses 148 and 150 of approximately 150 microseconds through comparator 118 to the microprocessor 124 indicating that the light emitting diodes are operating.

If a light emitter 84 or 86 fails, there will be no light transmission by the light emitters in response to pulses such as 38 and 140 and the voltage at monitor point 112 will remain in the high state. The substantially constant signal provided to the microprocessor 124 through comparator 118 indicates a light emitter 84, 86 error. This light emitter error signal or light transmission error signal 153 is stored in the microprocessor 124 and displayed to the mete reader at liquid crystal display 15 during reading of the energy meter 2.

Thus, the comparator circuit 100 is used to monitor the voltage drop at 112 caused by the conduction and emission of the two light emitters 84 and 86 and the transistor 104 as an indication of operation of the light emitters.

However, in checking the optical electronics system of an electronic register 20, it is desirable that certain of the errors or faults such as a failure error signal be displayed at liquid crystal display 15 of the energy meter 2 for the meter reader's use and information, while certain other errors such as a tampering error signal be stored within the energy meter and displayed, interpreted and responded to by others within the power company. Errors which indicate possible illegal tampering with the energy meter readout 2 for purposes of evading billing charges should be analyzed and acted upon by personnel other than the meter reader, possibly including legal and law enforcement personnel. Accordingly, the tampering error signal indicating possible tampering is detected, stored and subsequently provided and displayed away from the energy meter 2, and to personnel other than the meter reader, or the person tampering with the meter.

Since the time of use energy demand readings are used for billing purposes, it is possible as pointed out above that tampering, or attempted tampering, with the operation of the energy meter will be encountered. The optical electronics system of electronic register 20 utilizes the counting of pulses obtained when the light beam from the light emitters 84, 86 are disrupted by the rotating toothed optical disk. Tampering with such systems have included directing an extremely bright light into the enclosure 45 to provide continuous light to the light detectors, which may, as a result, be unable to detect disruptions in light transmission from the light emitters 84, 86 by the teeth 46 in the optical assembly 44. Accordingly, it becomes important to detect such light tampering.

As a result, the condition of the light detectors 84 and 86 is read before the pulsing of the light emitters 84 and 86 to determine if they are receiving light. Under such conditions, the presence of spurious light would be an indication of possible tampering, and a light tampering error signal 155 is generated. It is desirable that the light tampering error signal 155 be made available only to skilled personnel at the office of the power company for interpretation and corrective action. Such corrective action might involve seeking additional conclusive proof for possible legal or other action. For example, unscheduled readings or observations could be undertaken in cooperation with legal authorities to attempt to observe and establish the unauthorized light tampering. Accordingly, the light tampering error signal 155 is stored in microprocessor 122 and downloaded through an optical reader 135 to the computer at the office of the power company for analysis and corrective action.

While the present invention has been described through preferred embodiments, such embodiments are provided by way of example only. Numerous variations, changes and substitutions, including those discussed above will occur to those skilled in the art without departing from the scope of the present invention in the following claims.

What I claim is:

1. Apparatus, comprising:

metering means configured to be coupled between an end user and a power delivery system, said metering means comprising a rotatable shaft having shutter means attached thereto, at least one emitter/detector pair means disposed for having a portion of said shutter means pass therethrough and for generating electrical pulses indicative of a quantum of energy consumed by the end user, means for energizing said emitter means during a basic interval interrupt, the duration of the basic interval interrupt being in excess of the duration of energizing said emitter means, said emitter means having an on condition and an off condition and transitioning from the off condition to the on condition when energized, the emitter means being in a conducting condition and emitting a first signal when in the on condition;

means for checking whether said emitter means responds to a pre-determined manner as a result of energizing said emitter means, said checking means comprising means for providing the signal from a monitor point of said emitter means to comparator means for determining whether the signal from the monitor point is within a predetermined range, said emitter means and switching means being connected in series with an impedance, and wherein the signal provided from the monitor point is representative of the voltage at one end of the impedance; and means for generating an error signal when the emitter means does not respond to the energization in the pre-determined manner, the error signal being generated when the voltage at the monitor point does not change in a pre-determined manner as a result of energizing said emitter means.

2. An apparatus in accordance with claim 1 wherein the emitter means comprises means for emitting a first light signal.

3. An apparatus in accordance with claim 2 wherein the emitter means comprises a light emitting diode.

4. An apparatus in accordance with claim 2 wherein the checking means further comprises means for detecting the presence the first light signal.

5. An apparatus in accordance with claim 1 wherein said energizing means comprises switching means and energy supply means.

6. An apparatus in accordance with claim 1 further comprising storage means for storing the error signal.

7. A method of operating an electric energy meter in which energy consumption is measured utilizing a member rotatable between one or more light emitter and light detector pairs, said method comprising the steps of:

energizing the light emitter circuitry, the light emitter circuitry being energized during a basic interval interrupt and the duration of the basic interval interrupt being in excess of the duration of energizing the light emitter circuitry;

checking whether the light emitter circuitry responds in a pre-determined manner as a result of energizing the light emitter circuitry, said checking comprising the step of providing the signal from a monitor point of the light emitter circuitry to comparator means for determining whether the signal from the monitor point is within a predetermined range, said one or more light emitters and switching means being connected in series with an impedance, and wherein the signal provided from the monitor point is representative of the voltage at one end of the impedance; and generating an error signal of the light emitter circuitry does not respond to the energization in the pre-determined manner, the error signal being generated when the voltage at the monitor point does not change in a pre-determined manner as a result of energizing the light emitter circuitry.

8. A method in accordance with claim 7 wherein energizing the light emitter circuitry comprises the step of providing one or more energy pules to the light emitter circuitry and during a basic interval interrupt to initiate the normal operation of said light emitter circuitry during the basic interval interrupt.

9. A method in accordance with claim 1 wherein the light emitter circuitry is energized by one or more energy pulses that are substantially square waves, and the light emitter circuitry is pulsed for a period having a duration of approximately 150 microseconds.

10. A method in accordance with claim 9 wherein the basic interval interrupt has a duration of approximately 7 milliseconds.

11. A method in accordance with claim 10 wherein microprocessor means coupled to the comparator means generates the error signal as indicative of a failure of the light emitter circuitry, the microprocessor means generates the error signal when the comparator means provides a voltage signal without significant change upon application of the one or more pulses to the light emitter circuit during the basic interval interrupt.

12. In an electronic register for an electric energy meter in which energy demand is measured through a toothed optical shutter rotating between one or more emitter and detector pairs, a method of checking operation of the emitter circuit comprising the steps of:

connecting the light emitters in circuit with a switch which is pulsed to provide conduction through said emitters when no error exists;

monitoring a voltage within the emitter circuit before providing pulses to said switch;

monitoring said voltage within said emitter circuit after providing one or more pulses to said switch which are adequate to turn said emitters to the on condition;

determining whether there has been substantial change in the voltage being monitored before and after said pulses;

providing a light transmission error signal when there is no substantial change in said voltage being monitored upon the provision of said one or more pulses; and displaying said light transmission error signal at said electronic register.

13. The method to check operation of the light emitter circuitry in an electronic register of claim 12 wherein monitoring of said voltage is done during the period for energization of said one or more emitters.

14. The method to check operation of the emitter circuitry in an electronic register of claim 13 wherein a microprocessor is connected in circuit with said light transmission error signal, storing said light transmission error signal in said microprocessor, and subsequently displaying said light transmission error signal at said energy meter upon a command signal to said microprocessor.

15. The method to check operation of the emitter circuitry in an electronic register of claim 14 wherein said one or more pulses are provided for a duration of time significantly less than the duration of the periodic basic interval interrupt.

16. The method to check operation of the emitter circuitry in an electronic register of claim 15, wherein a timing circuit provides a signal to measure the monitored voltage at the end of each of said one or more pulses.

17. In an electronic register for an electric energy meter in which energy demand is sensed through a discontinuous shutter rotating between and breaking the light transmission between one or more emitter and detector pairs, a tester for checking the failure of one or more of the one or more emitters and light transmission comprising;
  one or more emitters in circuit with switching means and a resistive impedance across a supply voltage;
  means to pulse said emitter circuit to energize said one or more emitters under normal conditions;
  the pulses to said emitter circuit being of a smaller time duration than the time duration of the periodic basic interval interrupt of said electronic register;
  a comparator responsive to the failure of one or more of said one or more emitters;
  said comparator connected to a monitor point in circuit with said one or more emitters; and
  said comparator comparing the signal level at said monitor point during the basic interval interrupt period before and after said one or more pulses, and providing an emitter error signal when the signal level, before and after said one or more pulses is substantially the same.

18. A light emitter circuit tester in an electronic register for an electric energy meter of claim 17 wherein storage means are provided wherein said emitter error signal is stored and later provided upon the provision of a command signal.

19. A light emitter circuit tester in an electronic register for an electric energy meter of claim 17 wherein said comparator includes a reference voltage.

20. A light emitter circuit tester in an electronic register for an electric energy meter of claim 19 wherein a voltage divider is connected to said monitor point and across said one or more light emitters.

21. A light emitter circuit tester in an electronic register for an electric energy meter of claim 20 wherein the emitter error signal is developed at a junction of said voltage divider, said junction being connected to a microprocessor for storage of said emitter error signal, and subsequent delivery of said emitter error signal upon the presentation of a command signal to said microprocessor.

22. A light emitter circuit tester in an electronic register for an electric energy meter of claim 21 wherein said one or more emitters are light emitting diodes.

23. A light emitter circuit tester in an electronic register for an electric energy meter of claim 22 wherein said means to pulse said emitter circuit includes one or more transistors.

24. A light emitter circuit tester in an electronic register for an electric energy meter of claim 23 wherein each of said one or more pulses are in the order of approximately 150 microseconds duration, and said periodic basic interval interrupts are in the order of 7 milliseconds.

25. A light emitter circuit tester in an electronic register for an electric energy meter of claim 24 wherein the emitter error signal from said voltage diver is fed through said comparator to said microprocessor.

26. A light emitter circuit tester in an electronic register for an electric energy meter of claim 25 wherein said resistive impedance is a first resistor.

27. A light emitter circuit tester in an electronic register for an electric energy meter of claim 26 wherein said voltage divider comprises a second resistor and a third resistor across the series circuit comprising said one or more light emitter diodes and said one or more transistors.

28. A light emitter circuit tester in an electronic register for an electric energy meter of claim 27 wherein said first resistor is in series with a parallel circuit, said parallel circuit comprising said voltage divider in parallel with said one or more light emitter diodes and said one or more transistors, and the series-parallel circuit formed thereby is across a supply voltage.

* * * * *